United States Patent [19]
Podlesny et al.

[11] Patent Number: 5,657,291
[45] Date of Patent: Aug. 12, 1997

[54] MULTIPORT REGISTER FILE MEMORY CELL CONFIGURATION FOR READ OPERATION

[75] Inventors: Andrew V. Podlesny; Guntis V. Kristovsky; Alexander V. Malshin, all of Moscow, Russian Federation

[73] Assignee: Sun Microsystems, Inc., Mountain View, Calif.

[21] Appl. No.: 640,019

[22] Filed: Apr. 30, 1996

[51] Int. Cl.$^6$ .................................................. G11C 8/00
[52] U.S. Cl. ............................ 365/230.05; 365/230.06
[58] Field of Search .................. 365/230.05, 230.06, 365/230.01, 189.05, 189.08, 189.07, 189.04

[56] References Cited

U.S. PATENT DOCUMENTS

| | | | |
|---|---|---|---|
| 5,060,145 | 10/1991 | Scheuneman et al. | 365/230.05 |
| 5,062,081 | 10/1991 | Runaldue | 365/230.05 |
| 5,111,431 | 5/1992 | Garde | 365/230.05 |
| 5,289,427 | 2/1994 | Nicholes et al. | 365/230.06 |
| 5,398,211 | 3/1995 | Willenz et al. | 365/230.05 |

Primary Examiner—Tan T. Nguyen
Attorney, Agent, or Firm—D'Alessandro & Ritchie

[57] ABSTRACT

A mulitport register file including a memory cell array having a plurality of addressable memory locations and N bit lines associated with each memory cell in the memory cell array, wherein there are N port inputs to each addressable location in the memory cell array and at most N/2+1 word lines associated with each addressable memory location. A plurality of select and priority circuits having N port inputs and at most N/2+1 outputs, the outputs of a separate select and priority circuit connected to the word lines associated with each of the addressable memory locations to select a single bit line associated with each memory location corresponding to the port input with the highest priority when more than one port input at the same addressable memory location carries an address select signal. Read address comparators and a data transfer unit operate to ensure that the data from the memory cells is also output to sense amplifiers corresponding to the non-selected lower priority port inputs.

20 Claims, 5 Drawing Sheets

MULTIPORT REGISTER FILE MEMORY CELL CONFIGURATION FOR READ OPERATION

BACKGROUND OF THE INVENTION

1. Field of the Invention

The present invention relates to a multiport register file memory array. More particularly, the present invention relates to multiport register file memory array used in a floating point processing unit of a deep submicron device.

2. The Prior Art

Memory circuitry is designed to store data bits of information at specifically addressed locations in the memory. Each address location stores the data bits in memory cells wherein each memory cell stores one data bit. The data bits are usually input or output to or from the memory cells at each addressable location in groups. These groups are called data words, and a data word is usually specified as having a width of N bits. It is conventional to denote the bit positions at a memory address as A0 through AN. In a memory array, the same bit position of every address location is connected by a common bit line. In other words, the first bit position, A0, at an address location is connected to the first bit position, A0, at every other address location by a common bit line. Likewise each of the A1 bit positions are connected, as are each of the same bit positions at each address.

To access a specific address in the memory, the address is presented to decoding circuitry, i.e. an address port, and the output from the address port transmits an address select signal to a word line at the desired location in the memory array. When the address select signal is on the word line associated with a memory location data is transferred in or out of each of the individual memory cells at the specified address. The data of each memory cell is transferred on its associated bit line.

Some memory arrays, termed a multiport array, have more than one address port. Consequently, during a single read/write cycle, more than one address may be decoded and data transfer made for the decoded addresses. It is conventional that for every address port, each memory cell will have an associated bit line. In other words, if there are ten ports, then each memory cell will have ten common bit lines associated with it.

In a multiport memory array, such as the one disclosed in the reference "A 320-MFLOPS CMOS Floating-Point Processing Unit for Superscalar Processors", I. Nobohiro et al., IEEE Journal of Solid-State Circuits, Vol. 28, No. 3, Mar. 1993, there are several common bit lines for each memory cell in the array. The multiport memory array disclosed in Nobohiro et al. has common bit lines which are split into two groups. A first group of four write bit lines for providing input to each memory cell in the array, and a second group of six read bit lines for providing output information from each memory cell in the array. The memory array shown in Nobiro et al. is a register file. It is an array of thirty-two registers, each register having its own address and each containing sixty-four bits of information stored in two data words, each thirty-two bits in length. The register file is used in a floating point processing unit integrated with a RISC core processor.

As shown in Nobohiro et al., and as is conventional, associated with each address or register in the register file there are word lines. There is a separate word line at each address for controlling each of the separate read and write bit lines. Each of the separate word lines is connected to an address port. For example, when there are N ports to the memory array, there will be N word lines for each address, and N bit lines for every bit position at any address. Accordingly, the size of the multiport memory array varies as a square of the number of ports to the array. This is the case, since, for every memory cell in the array, the number of bit lines is equal to the number of word lines, and the number of word lines for every address is the same as the number of ports to the memory array.

In the operation of a conventional multiport array, as an address is presented to one of the read or write ports, it is decoded and an address signal is transmitted to the decoded address location. The address signal is transmitted on the word line associated with the address port the address passed through. The address signal on the word line will cause the contents of each of the memory cells at the selected address to either be written to or read from. The data transfer for each memory cell takes place on the read or write bit lines, each of which is associated with a separate word line. During a single read/write cycle, a multiple number of reads up to the number of read ports may be read from the same address or different addresses and a multiple number of writes up to the number of write ports into different addresses may be made.

Since more than one read may be made from the same memory address during the same read/write cycle, the maximum amount of current to the memory cell is determined by the number of read ports. To protect the memory cell, additional buffer transistors are used in each cell for each read port. Because of the additional buffer transistors, a bit line must be either a read bit line or a write bit line, but it cannot be used as both, or in other words, as a common read/write bit line. With the use of separate bit lines for the read and write operations, separate word lines for the read and write operations are also employed.

As pointed out above, the size of the register file memory array varies according to the square of the number of ports, wherein the number of ports to the memory array is equal to both the number of word lines and bit lines. In deep submicron devices, the amount of delay introduced into a circuit due to the interconnect between circuit elements is a significant consideration. It is, in fact, often a more important consideration than gate delay. One way to reduce the interconnect delay is to reduce the length of bit lines and word lines. This can be accomplished by reducing the size of the register file memory array.

It is therefore an object of the present invention to reduce the area of the multiport register file memory array to minimize interconnect delay.

It is another object of the present invention to minimize the interconnect delay in the multiport register file memory array to increase the frequency of the memory access cycles to the multiport register file memory array.

It is another object of the present invention to reduce the area of the multiport register file memory array having N ports by reducing the number of word lines for each memory cell from N to between $\log_2 N$ and $N/2+1$.

It is another object of the present invention that for a multiport register file memory array of N ports to have N bit lines and between $\log_2 N$ and $N/2+1$ word lines for each memory cell.

BRIEF DESCRIPTION OF THE INVENTION

A multiport register file according to the present invention having N port inputs to each addressable memory location in the register file. Data is transferred in and out of memory cells at each addressable memory location on one of N selected bit lines associated with each memory cell, wherein the selected bit line corresponds to the highest priority port input when more than one port input to the same addressable memory location carries an address select signal.

According to one aspect of the present invention, the selection of the bit line corresponding to the highest priority port input is made by a separate select and priority circuit associated with the addressed memory location. With the selection of a single bit line, buffer transistors are not required for the read operation and the bit lines may be used for both input and output operations. Control signals from the select and priority circuit are placed on between $\log_2 N$ and $N/2+1$ word lines associated with each memory location. The number of word lines associated with each memory location is substantially less than a conventional multiport register file, and are used for both input and output operations. The absence of the output buffer transistors and the presence of fewer word lines than found in a conventional multiport register file substantially reduces the size of the multiport register file, thereby minimizing the interconnect delay in the submicron device size multiport register file.

According to another aspect of the present invention, when more than one address select signal is presented to the port inputs of an addressable memory location, read address comparators and a data transfer unit operate to ensure that the data from the memory cells is also output to sense amplifiers corresponding to the non-selected lower priority port inputs.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
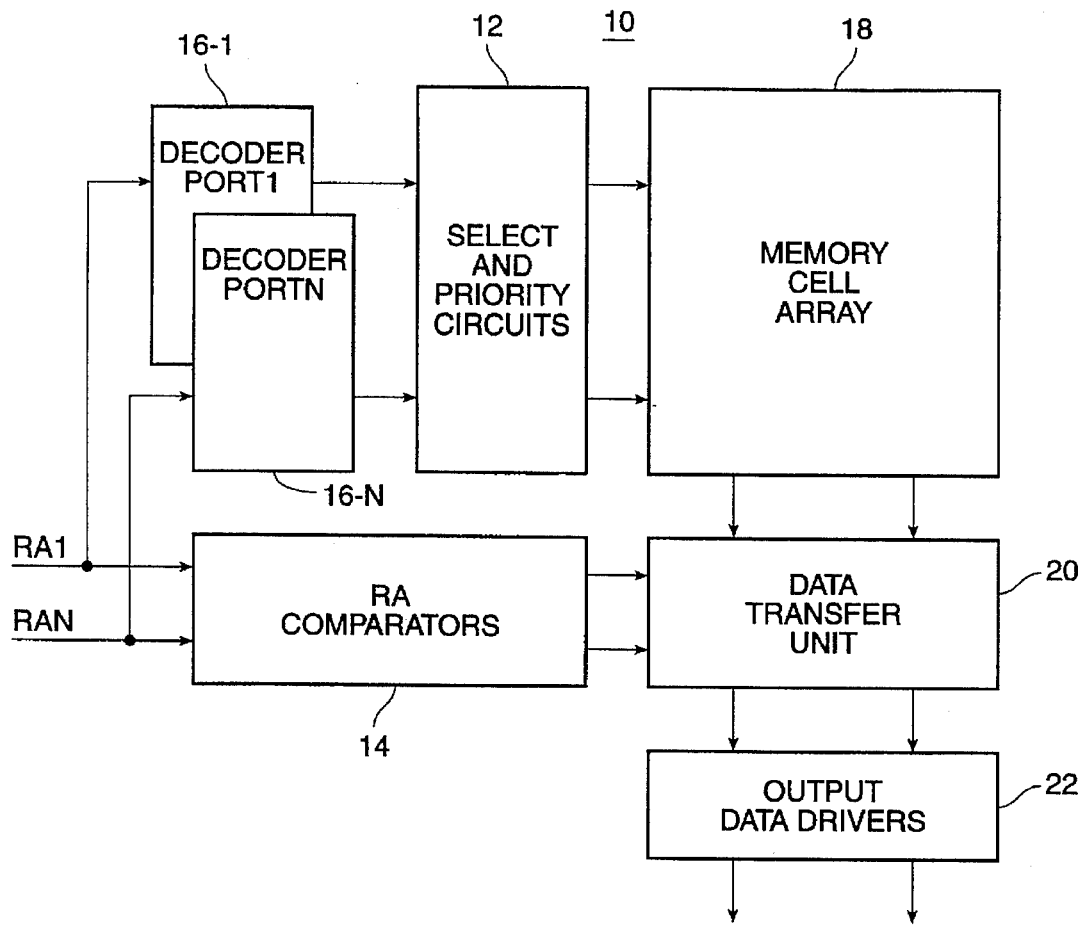
FIG. 1 is a block diagram of the multiport register file according to the present invention.

In FIG. 1, a block diagram of the multiport register file 10 according to the present invention is shown. As will be discussed below, with the use of select and priority circuits 12 and read address comparators 14, the number of word lines for each memory address in the multiport register file 10 may be reduced from N to at least (N/2)+1, and additional buffer transistors for the read ports are eliminated. As a result, the size of a conventional multiport register file is reduced, and the delay through multiport register file 10 is minimized.

In FIG. 1, read addresses RA1 through RAN are presented to decoder ports 16-1 through 16-N, respectively. Decoder circuits are well known to those of ordinary skill in the art, and any of several implementations could be used as the decoder ports 16-1 through 16-N. When an address is presented to any of decoder ports 16-1 through 16-N, the address is decoded and a read address signal is transmitted by the decoder port 16 to a select and priority circuit 12 connected to the memory cells corresponding to the decoded address. Each addressable memory location in the memory cell array 18 has an associated select and priority circuit 12.

If the same address is presented to more than one decoder port 16-1 through 16-N, the select and priority circuit 12 associated with that memory address determines which of the decoder ports 16 has the higher priority. The decoder port 16 with the higher priority will be the one allowed to access the desired memory location, and the contents of the memory cells at that address will be placed on the bit lines corresponding to the selected higher priority decoder port 16-1 through 16-N. The operation of select and priority circuits 12 will be explained more fully below.

Read addresses RA1 through RAN are also presented to the read address comparators 14. The read address comparators 14 generate control signals for a data transfer unit 20 disposed between the memory cell array 18 and the output data drivers 22. When the same address has been presented to more than one of the decoder ports 16-1 through 16-N, the read address comparators 14 and data transfer unit 20 operate to ensure that the data from the memory cells which has been placed on the bit lines corresponding to the selected highest priority decoder port 16 is also placed on the bit lines corresponding to the non-selected lower priority decoder ports 16-1 through 16-N. The operation of the read address comparators 14 and the data transfer unit 20 will be described more fully below.

Figure 2:
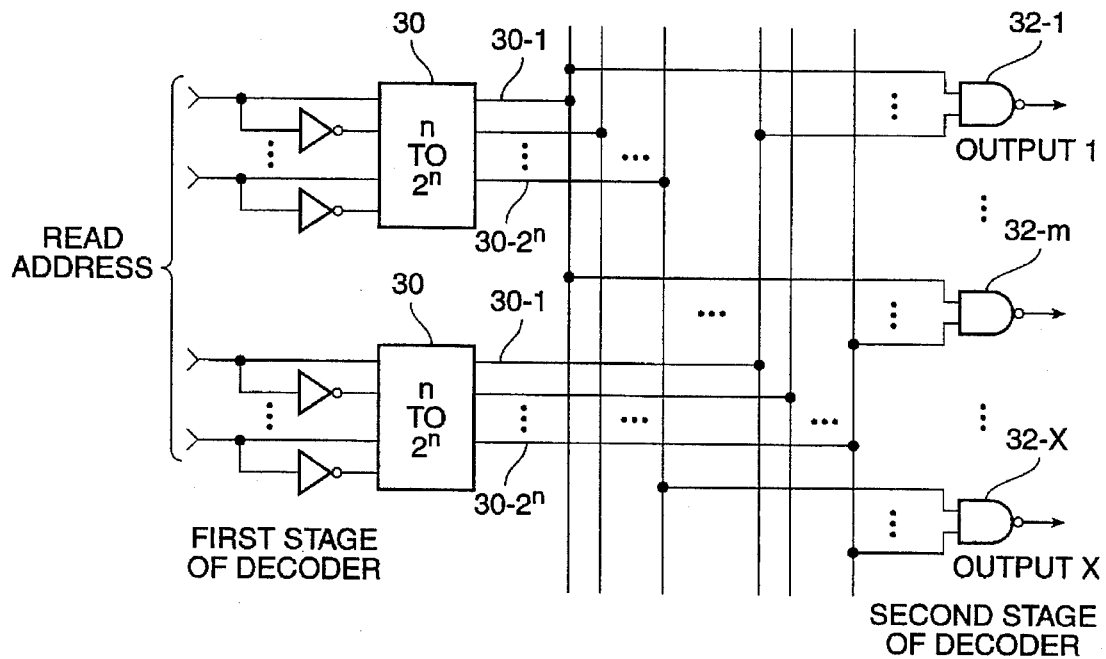
FIG. 2 is a circuit diagram of a decoder port suitable for use in the multiport register file according to the present invention.

Referring now to FIG. 2, decoder port 16 is shown in more detail. The address to be decoded is presented to a first stage of the read address decoder 16. The first decoder stage is shown as a plurality of n to $2^n$ decoders 30, wherein one bit of the address is input to a single input of one of n to $2^n$ decoders 30. The outputs 30-1 to 30-$2^n$ of each of the n to $2^n$ decoders 30 are connected to the inputs of NAND gates 32 comprising a second decoder stage. The number of NAND gates 32 in the second decoder stage is equal to the number of addressable locations in the memory cell array 18 shown in FIG. 1. The outputs of the NAND gates 32 are connected to port inputs of the select and priority circuit 12 associated with each memory location in the memory cell array 18.

For example, in a memory cell array with 256 addressable locations and two decoder ports 16-1 and 16-2, a first 8-bit wide memory address may be fed into decoder port 16-1 and a second 8-bit wide memory address may be fed into decoder port 16-2. Each of the decoder ports 16-1 and 16-2 may have four 2 to $2^2$ decoders in a first stage connected to 256 four-input NAND gates in a second stage. For both decoder ports 16-1 and 16-2, the outputs from 256 four-input NAND gates in the second decoder stage will be connected in a one-to one manner to the first and second port inputs of the select and priority circuits 12 at each addressable memory location in the memory cell array 18.

Generally, as can be seen in FIG. 2, the 30-1 outputs from the n to $2^n$ decoders in the first stage are all connected to NAND gate 32-1, the 30-$2^n$ outputs from the n to $2^n$ decoders in the first stage are all connected to NAND gate 32-x, and some combination of the 30-1 through 30-$2^n$ outputs from the n to $2^n$ decoders in the first stage are all connected to NAND gate 32-m. The output of NAND gate 32-1 will be connected to a port input of the select and priority circuit 12 corresponding to the lowest memory address, the output of NAND gate 32-x will be connected to a port input of the select and priority circuit 12 corresponding to the highest memory address, and the output of NAND gate 32-m will be connected to a port input of the select and priority circuit 12 corresponding to some intermediate memory address. If, in the example given above, NAND gate 32-m is a four-input gate wherein three of the inputs are connected to the three least significant 30-1 outputs and the fourth input is connected to the most significant of the $30\text{-}2^n$ outputs, then NAND gate 32-m will correspond to intermediate memory address 192.

Figure 3:
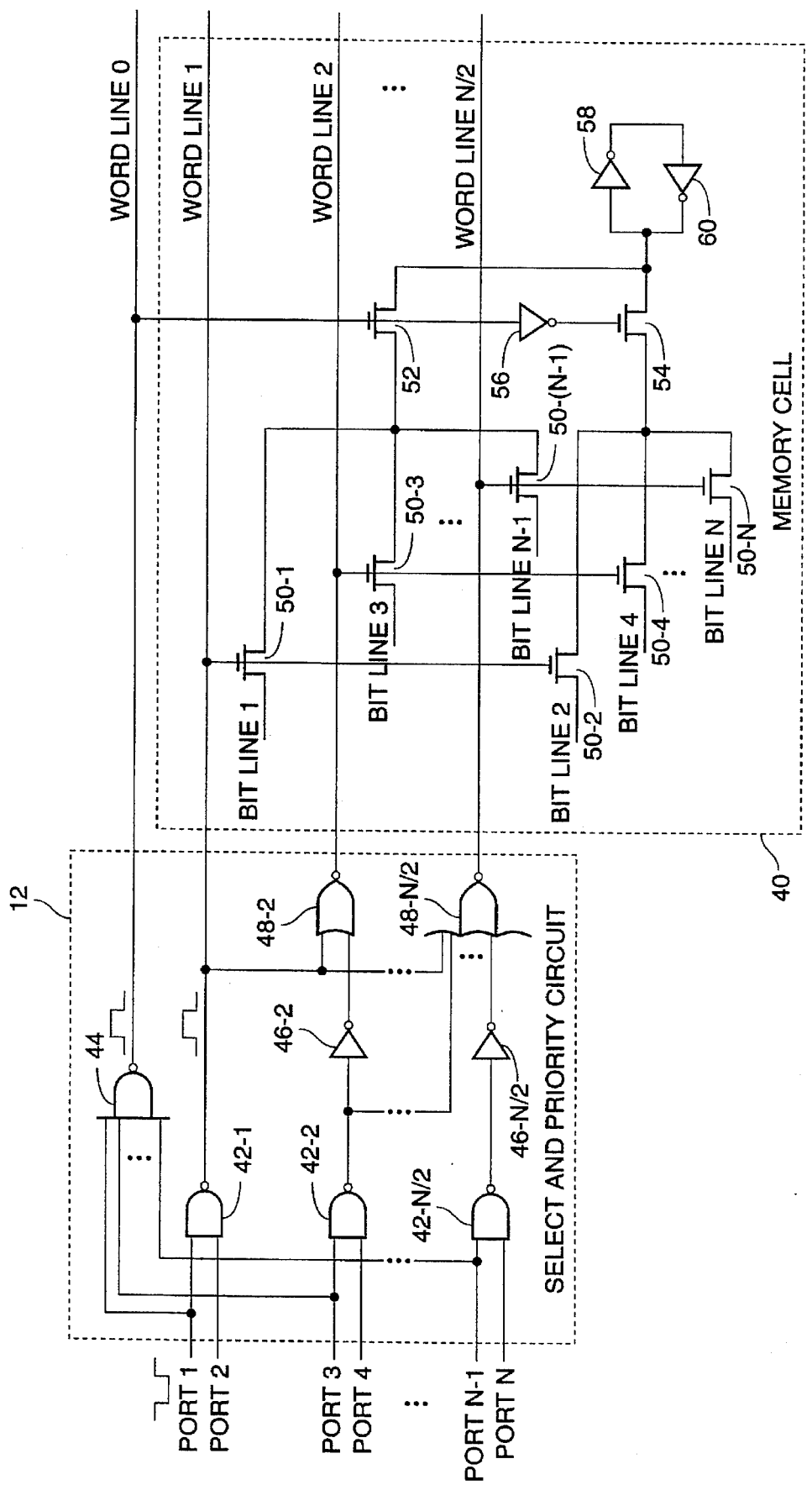
FIG. 3 is a circuit diagram of a select and priority circuit and memory cell according to the present invention.

Referring now to FIG. 3, a select and priority circuit 12 and a memory cell 40 from the memory cell array 18 are shown in greater detail. As will be shown below, the number of word lines associated with memory cell 40 is fewer than the number of word lines associated with each memory address in a conventional multiport memory array. The select and priority circuit 12 is associated with the memory address containing memory cell 40. Though not shown to avoid overcomplicating the disclosure, it will be recognized that the memory address containing memory cell 40 may contain other memory cells, and that the select and priority circuit 12 will also be associated with the additional memory cells at the memory address.

In FIG. 3, the like outputs of the decoder ports 16-1 through 16-N are connected to the port I through N inputs of select and priority circuit 12. For example, if select and priority circuit 12 corresponds to the lowest memory address and the decoder port 16 shown in FIG. 2 is decoder port 16-1, then the output of NAND gate 32-1 of FIG. 2 will be connected to the port 1 input of select and priority circuit 12 shown in FIG. 3. Referring to FIG. 3, when an address select signal is presented on a single one of port 1 through N inputs, the memory cell 40 will respond by placing its contents on the bit line associated with the port 1 through N input carrying the address select signal. When address select signals are presented to more than one port 1 through N input, the select and priority circuit 12 will place the content of memory cell 40 on the bit line corresponding to the port 1 through N input having the highest priority. The port 1 through N inputs are ordered such that port 1 input has the highest priority and port N input has the lowest. For example, when an address signal is presented to both the port 2 and port N inputs, the content of memory cell 40 will be placed on bit line 2, because the port 2 input has a higher priority than the port N input.

In FIG. 3, port 1 and port 2 inputs are connected to the inputs of a two-input NAND gate 42-1, port 3 and port 4 inputs are connected to the inputs of a two-input NAND gate 42-2, and port N-1 and port N inputs are connected to the inputs of a two-input NAND gate 42-N/2. The odd numbered port inputs, i.e. port 1 input, port 3 input and port N-1 input, are also connected to N/2-input NAND gate 44. The output of each two-input NAND gate 42-2 through 42-N/2 is connected to an inverter 46-2 through 42N/2. The output of two-input NAND gate 42-1 is not connected to an inverter.

The output of two-input NAND gate 42-1 and the inverter 46-2 output are connected to two-input NOR gate 48-2. The output of two-input NAND gate 42-1 is also connected along with the output of two-input NAND gate 44-2 and the inverter 46-N/2 output to N/2-input NOR gate 48-N/2. Each NOR gate 48 has an input connected to the inverted output of one of the two-input NAND gates 42. Considering the outputs of two-input NAND gates 42-1 through 42-N/2 as being ordered, with the output of two-input NAND gate 42-1 as the highest ordered output and the output of two-input NAND gate 42-N/2 as the lowest ordered output, it can be seen that each NOR gate 48 also has inputs connected to the outputs of each of the two-input NAND gates 42 having a higher order than the two-input NAND gate 42 whose inverted output is connected to the same NOR gate 48.

The output of NAND gate 44 is connected to word line 0, the output of two-input NAND gate 42-1 is connected to word line 1, and the outputs of NOR gates 48-2 through 48-N/2 are connected to word lines 2 through N/2. In the memory cell 40, word line 1 is connected to the gates of N-channel MOS pass transistors 50-1 and 50-2, word line 2 is connected to the gates of N-channel MOS pass transistors 50-3 and 50-4, and word line N/2 is connected to the gates of N-channel MOS pass transistors 50-(N-1) and 50-N. Word line 0 is connected to the gate of N-channel MOS pass transistor 52, and to the gate of N-channel MOS pass transistor 54 through inverter 56. The sources of both N-channel MOS pass transistors 52 and 54 are connected to contents of the memory cell 40 stored by cross coupled inverters 58 and 60. The drain of N-channel MOS pass transistor 52 is connected to the source of pass transistors 50-1, 50-3 and 50-(N-1), and the drain of N-channel MOS pass transistor 54 is connected to the source of N-channel MOS pass transistors 50-2, 50-4 and 50-N. The sources of N-channel MOS pass transistors 50-1 through 50-N are connected to bit lines 1 through N, respectively.

The operation of the select and priority circuit 12 and the memory cell 40 shown in FIG. 3 will now be explained. Address select signals are presented to select and priority circuit 12 as active LOW signals, otherwise the inputs to select and priority circuit 12 are at an inactive HIGH signal level. Those of ordinary skill in the art will readily understand that the address signals could be active HIGH with the appropriate substitutions for the logic gates and the pass transistors. Presenting a LOW logic level to any of the two-input NAND gates 42-1 through 42-N/2 will cause the output of that gate to go HIGH.

When only a single LOW logic level input is presented to the two-input NAND gates 42-1 through 42-N/2, the HIGH output from the two-input NAND gate 42-1 through 42-N/2 with the LOW input will essentially drive two of the bit line N-channel MOS pass transistors 50. In other words, the output of two-input NAND gate 42-1 drives N-channel MOS pass transistors 50-1 and 50-2, the output of two-input NAND gate 42-2 through inverter 46-2 and NOR gate 48-2 drives N-channel MOS pass transistors 50-3 and 50-4, and the output of two-input NAND gate 42-N/2 through inverter 46-N/2 and NOR gate 48-N/2 drives N-channel MOS pass transistors 50-(N-1) and 50-N.

To ensure that only two of the N-channel MOS pass transistors 50 will have a HIGH signal applied to their gates, in the event that more than a single LOW signal is presented to the two-input NAND gates 42-1 through 42-N/2, each of the NOR gates 48 will output a LOW logic level whenever a HIGH logic level is being output from a two-input NAND gate 42 with a priority higher than the two-input NAND gate 42 to which each of the NOR gates 48 is connected through inverters 46. For example, when the output of two-input NAND gate 42-1 goes HIGH, N-channel MOS pass transistors 50-1 and 50-2 will be turned ON, and each of the N-channel MOS pass transistors 50 connected to the outputs of the NOR gates 48 will remain OFF. It can be seen that the HIGH output of two-input NAND gate 42-1 is also connected to the NOR gates 48 which makes the output of the NOR gates 48 LOW even when the output of any of the two-input NAND gates 42-2 through 42-N/2 is HIGH.

For each of the remaining NAND gates 42-2 through 42-N/2, when one of their outputs is HIGH, they behave similarly to NAND gate 42-1, as long as the output of a two-input NAND gate 42 of higher priority does not also go HIGH. For example, when the output of two-input NAND gate 42-2 goes HIGH, it is inverted to a LOW logic level by inverter 46-2, and then output from NOR gate 48-2 is a HIGH logic level which turns ON N-channel MOS pass transistors 50-3 and 50-4. The HIGH logic level from the output of two-input NAND gate 42-2 is also connected to the NOR gates 48-3 through 48-N/2 to ensure that each output of NOR gates 48-3 through 48-N/2 will be a LOW logic level.

As discussed above, during a read operation, only the bit line corresponding to the port 1 through N input with the highest priority will have the contents of the storage element represented by the cross-coupled inverters 58 and 60 placed on it. However, when the output of any of the two-input NAND gates 42 goes HIGH, two N-channel MOS pass transistors 50 are turned ON. A further selection is made between these two N-channel MOS pass transistors 50. The selection is made by N/2-input NAND gate 44 whose output will go HIGH if any of the odd numbered ports is carrying an address select signal. The HIGH output from N/2-input NAND gate 44 will turn ON N-channel MOS pass transistor 52. This will place the contents of the cross-coupled inverters 58 and 60 on the odd numbered bit line connected to the ON N-channel MOS pass transistor 50. The other N-channel MOS pass transistor 50 which is also ON will not place the contents of the cross-coupled inverters 58 and 60 onto its associated bit line because the inverter 56 will turn OFF pass transistor 54. In the event both of the port inputs to the same two-input NAND gate 42 have an address select signal, then the odd numbered port, having a higher priority, will have the contents of the cross-coupled inverters 58 and 60 placed on its associated bit line due to the fact that N-channel MOS pass transistor 52 will be turned ON.

Referring now to FIG. 4, a schematic diagram of the data transfer unit 20 is shown along with its connection to read address comparators 14. In FIG. 4, each read address comparator 14 is shown in block form. Shown in FIG. 5 is a circuit diagram of a read address comparator 14. Those of ordinary skill in the art will readily recognize that may different embodiments of a read address comparator 14 are possible without departing from the inventive concepts herein. The read address comparators 14 and the data transfer unit 20 ensure that when the same address is accessed through two different decoder ports 16-1 through 16-N that the contents of the memory address will not only be placed on the bit line corresponding to the decoder port 16 of higher priority as explained above, but will also be placed on a bit line corresponding to the decoder port or ports 16 having a lower priority.

As discussed above with regard to FIG. 3, RA1 through RAN were decoded by decoder ports 16-1 through 16-N, respectively. Like decoder ports 16-1 through 16-N, RA1 through RAN are also ordered with RA1 having the highest priority and RAN the lowest priority. In FIG. 4, each RA1 through RAN is compared with every RA with a higher priority. To make these comparisons, the read address comparators 14 are partitioned into N-1 groups, including as groups, read address comparators 14-2 to read address comparators 14-N.

As shown in FIG. 4, in read address comparators 14-N, RAN is compared with each RA having a higher priority, namely, RA1 through RA(N-1), in read address comparators 14-(N-1), RA(N-1) is compared with each RA having a higher priority, namely, RA1 through RA(N-2), and in read address comparator 14-2, RA2 is compared with each RA having a higher priority, namely, RA1. Further, the read address comparators 14 within each of the N-1 read address comparator groups is ordered. In each of the N-1 read address comparator groups, the read address comparator 14 which makes a comparison with RA1 is the read address comparator 14 with the highest priority in that read address comparator group.

The comparison between read addresses is performed as shown in FIG. 5, wherein each bit position A0 through AM in a first address is compared with a corresponding bit position B0 through BM in a second address. The comparison between each bit position is made by XOR gates 80-1 through 80-m whose outputs will be LOW if both bits at the same position for the two addresses are the same. The outputs of the XOR gates 80-1 through 80-m are input to a NOR gate 82 whose output will be HIGH only if all its inputs are LOW. The output of NOR gate 82 is passed through inverter 84. Accordingly, if the both addresses being compared by read address comparator 14 are the same, the output form the inverter 84 will be a LOW logic level.

Referring again to FIG. 4, the outputs of the read address comparators 14 in the same group provide control signals for an associated group of P-channel MOS pass transistors 102 in the data transfer unit 20. The gates in the P-channel MOS pass transistors 102 are driven by control signals from the read address comparators 14, the drains of all of the P-channel MOS pass transistors 102 in the same group are connected to a sense amplifier 100, and the source of each separate P-channel MOS pass transistors 102 is connected to a single bit line. The control signals drive P-channel MOS pass transistors 102 to pass the voltage on the bit lines to the sense amplifiers 100. In each group of read address comparators 14, the output of the read address comparator 14 with the highest priority drives the gate of the P-channel MOS pass transistor 102-1, of its associated group. The P-channel MOS pass transistor 102-1 in each of the groups is connected to bit line 1. The P-channel MOS pass transistors 102 in each group are ordered such that P-channel MOS pass transistor 102-1 has the highest priority.

The output of each read address comparator 14 with a priority less than the highest priority in its group of read address comparators 14 is connected to a NOR gate 104. The output through an inverter 106 of each read address comparator 14 with a higher priority than the read address comparator 14 to which each of the NOR gates 104 is connected, is also connected to the same NOR gate 104. The inverted outputs of all of the read address comparators 14 in each of the groups, with the exception of read address comparator group 14-2, are also connected to a NOR gate 104 which does not have a non-inverted output of a read address comparator 14 connected to it.

The outputs of each of the NOR gates 104 is connected through an inverter 108 to a P-channel MOS pass transistor 102. The outputs of the NOR gates 104 connected to each group of read address comparators 14 are ordered such that the NOR gate 104 connected to the non-inverted output of the read address comparator 14 with the highest priority also has the highest priority. The NOR gates 104 which are not connected to a non-inverted output of a read address comparator 14 have the lowest priority. The outputs of the NOR gates 104 through inverters 108 are connected to the P-channel MOS pass transistors 102 in its associated group in order such that the NOR gate 104 in each group with the highest priority is connected to the P-channel MOS pass transistor 102 in its group with the second highest priority.

The operation of data transfer unit 20 will now be explained. When an RA is compared to the RAs having a higher priority in each group by the read address comparators 14 in the group, the bit line associated the highest priority RA being compared to the lower priority RA and having the same address as the lower priority RA will be connected to the sense amplifier 100 associated with the group by a P-channel MOS pass transistor 102. The gate of the P-channel MOS pass transistor 102 which is turned ON to connect the bit line to the sense amplifier 100 is connected either directly or through a NOR gate 104 and inverter 108 to the output of the read address comparator 14 with the highest priority and having a match to the lower priority RA. When the address of the low priority RA is not the same as the address of any other RA, the gate of the P-channel MOS pass transistor 102 connected through an inverter 108 to the output of the NOR gate 104 with the lowest priority will connect the sense amplifier 100 to the bit line to which the P-channel MOS pass transistor 102 is also connected, or in the case of read address comparator group 14-2, the gate of the P-channel MOS pass transistor 102 to the output of inverter 106.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multiport register file comprising:

a memory cell array having a plurality of addressable memory locations and a plurality of bit lines associated with each memory cell in said memory cell array, each of said addressable locations comprising at least one memory cell and having a plurality of associated word lines;

a plurality of select and priority circuits having a plurality of port inputs and outputs, said outputs of a separate one of said select and priority circuits connected to said word lines associated with a separate one of said addressable memory locations;

a plurality of read address comparators, having a plurality of read address inputs, and outputs to provide control signals in response to a comparison of read addresses present on said plurality of said read address inputs; and a data transfer unit having a group of control inputs connected to said outputs of said read address comparators, and a group of data inputs connected to said bit lines, wherein data on said bit lines is transferred to outputs of said data transfer unit in response to said control signals.

2. The multiport register file of claim 1, wherein said multiport register file is a portion of a microprocessor system.

3. The multiport register file of claim 2, wherein said plurality of bit lines is N, said plurality of port inputs is N, said plurality of select and priority outputs is at most (N/2)+1, and said plurality of word lines associated with each of said addressable memory locations is at most (N/2)+1.

4. The multiport register file of claim 1, wherein said plurality of bit lines are common for both input and output operations of said multiport register file.

5. The multiport register file of claim 1, wherein said read address comparators comprise N-1 groups having a plurality of inputs, and N-2 of said N-1 groups of said read address comparators having a plurality of outputs and one of said N-1 groups of said read address comparators having a single output.

6. The N-1 groups of read address comparators of claim 5, wherein the read address comparators in each of said N-1 groups, compare a single address with each read address having a higher priority.

7. The multiport register file of claim 1, wherein each of said read address comparators further comprise a plurality of exclusive-or gates equal to a number of bit positions of each read address, each of said plurality of exclusive-or gates having two inputs and an output;

a not-or gates having a plurality of inputs connected to said outputs of said plurality of exclusive-or gates, and an output; and an inverter having an input connected said output of not-or gate, and an output.

8. The multiport register file of claim 1, wherein said data transfer unit comprises N-1 groups, N-2 of said groups having a plurality of control inputs, and a single one of said N-1 groups having one control input, and each of said N-1 groups having a single output.

9. The multiport register file of claim 8, further comprising a plurality of not-or gates in said N-2 groups having a plurality of inputs, an output, and a plurality of pass transistors in said N-2 groups, said plurality of not-or gates in each of said N-2 groups being ordered from a highest priority to a lowest priority, said control inputs in each of said N-2 groups being ordered from a highest priority to a lowest priority and said bit lines being ordered from a highest priority to a lowest priority, each separate control input other than the highest priority control input in each of said N-2 groups connected to an input of a separate one of said plurality of not-or gates in said N-2 group, each of said control inputs in said N-2 group being inverted and connected to an input of each separate not-or gate in said N-2 group having a control input connected thereto having a lower priority than said inverted control inputs, and each of said inverted control inputs connected to said lowest priority not-or gate in said N-2 group, said highest priority control input in each of said N-2 groups connected to a gate of one of said plurality of pass transistors in said N-2 group and each separate not-or gate output in each of said N-2 groups being inverted and connected to a gate of a separate one of said plurality of pass transistors in said N-2 group, said pass transistor connected to the highest priority control input having a drain connected to said highest priority bit line, and said gates of remaining pass transistors in each of said N-2 groups connected to said inverted outputs from said ordered not-or gates having a drain connected to a bit line having a similar priority as said ordered not-or gates, said single one of said N-1 groups having a control input connected to a gate of a pass transistor having a drain connected said highest priority bit line, said control input in said single one of N-1 groups being inverted and connected to a gate of a pass transistor having a drain connected to a second highest priority bit line, each pass transistor in each separate N-2 group having a source connected to sense amplifier, and said highest priority bit line connected to a sense amplifier.

10. A method for operating a multiport register file having a least one memory cell at each address memory location, comprising the steps of:

detecting an address select signal at any of a plurality of ordered port inputs of a select and priority circuit associated with each memory address location in the multiport register file;

selecting said port input detecting said address select signal having a highest order;

placing the contents of the at least memory cell on a bit line corresponding to said selected port input;

comparing each memory address at each port with each memory address at every other port having a higher priority to determine if a same memory address at a lower priority port is also at a higher priority port; and transferring the data from a bit line associated with a highest of said higher priority ports compared with said lower priority port to an output associated with said lower priority port when said compared addresses are said same memory address.

11. The method of claim 10, further comprising the steps of:

sending said memory addresses by a microprocessor to decoder ports for said port inputs and for comparison of each memory address at each port with each memory address at every other port having a higher priority.

12. A method for providing a multiport register file, comprising the steps of:

providing a memory cell array having a plurality of addressable memory locations and a plurality of bit lines associated with each memory cell in said memory cell array, each of said addressable locations comprising at least one memory cell and having a plurality of associated word lines;

providing a plurality of select and priority circuits having a plurality of port inputs and outputs, said outputs of a separate one of said select and priority circuits connected to said word lines associated with a separate one of said addressable memory locations;

providing a plurality of read address comparators, having a plurality of read address inputs, and outputs to provide control signals in response to a comparison of read addresses present on said plurality of said read address inputs; and providing a data transfer unit having a group of control inputs connected to said outputs of said read address comparators, and a group of data inputs connected to said bit lines, wherein data on said bit lines is transferred to outputs of said data transfer unit in response to said control signals.

13. The method of claim 12, further comprising the step of providing a microprocessor system including said multiport register file.

14. The method of claim 12, further comprising the step of providing said plurality of bit lines as common for both input and output operations of said multiport register file.

15. The method of claim 12, further comprising the step of providing said plurality of bit lines as N, said plurality of port inputs as N, said plurality of select and priority outputs as at most (N/2)+1, and said plurality of word lines associated with each of said addressable memory locations as at most (N/2)+1.

16. The method of claim 15, further comprising the step of providing for said N-1 groups of read address comparators of claim 5, wherein the read address comparators in each of said N-1 groups, compare a single address with each read address having a higher priority.

17. The method of claim 12, further comprising the step of providing said read address comparators as N-1 groups having a plurality of inputs, and N-2 of said N-1 groups of said read address comparators as having a plurality of outputs and one of said N-1 groups of said read address comparators as having a single output.

18. The method of claim 12, further comprising the step of providing each of said read address comparators as a plurality of exclusive-or gates equal to a number of bit positions of each read address, each of said plurality of exclusive-or gates having two inputs and an output;

a plurality of not-or gates having a plurality of inputs connected to said outputs of said plurality of exclusive-or gates, and an output; and an inverter having an input connected said output of not-or gate, and an output.

19. The method of claim 12, further comprising the step of providing said data transfer unit comprises N-1 groups, N-2 of said groups having a plurality of control inputs, and a single one of said N-1 groups having one control input, and each of said N-1 groups having a single output.

20. The method of claim 19, further comprising the step of providing a plurality of not-or gates in said N-2 groups having a plurality of inputs, an output, and a plurality of pass transistors in said N-2 groups, said plurality of not-or gates in each of said N-2 groups being ordered from a highest priority to a lowest priority, said control inputs in each of said N-2 groups being ordered from a highest priority to a lowest priority and said bit lines being ordered from a highest priority to a lowest priority, each separate control input other than the highest priority control input in each of said N-2 groups connected to an input of a separate one of said plurality of not-or gates in said N-2 group, each of said control inputs in said N-2 group being inverted and connected to an input of each separate not-or gate in said N-2 group having a control input connected thereto having a lower priority than said inverted control inputs, and each of said inverted control inputs connected to said lowest priority not-or gate in said N-2 group, said highest priority control input in each of said N-2 groups connected to a gate of one of said plurality of pass transistors in said N-2 group and each separate not-or gate output in each of said N-2 groups being inverted and connected to a gate of a separate one of said plurality of pass transistors in said N-2 group, said pass transistor connected to the highest priority control input having a drain connected to said highest priority bit line, and said gates of remaining pass transistors in each of said N-2 groups connected to said inverted outputs from said ordered not-or gates having a drain connected to a bit line having a similar priority as said ordered not-or gates, said single one of said N-1 groups having a control input connected to a gate of a pass transistor having a drain connected said highest priority bit line, said control input in said single one of N-1 groups being inverted and connected to a gate of a pass transistor having a drain connected to a second highest priority bit line, each pass transistor in each separate N-2 group having a source connected to sense amplifier, and said highest priority bit line connected to a sense amplifier.

* * * * *

UNITED STATES PATENT AND TRADEMARK OFFICE
CERTIFICATE OF CORRECTION

PATENT NO. : 5,657,291
DATED : August 12, 1997
INVENTOR(S) : Andrew V. Podlesny, Guntis V. Kristovsky, Alexander V. Malshin It is certified that error appears in the above-identified patent and that said Letters Patent is hereby corrected as shown below:

Column 1, line 53: replace "split into two groups. A first group" with --split into two groups, a first group--.

Column 1, line 21: replace "AO" with --A0--.

Column 1, line 24: replace "AO" with --A0--.

Column 1, line 25: replace "AO" with --A0--.

Figure 4A:
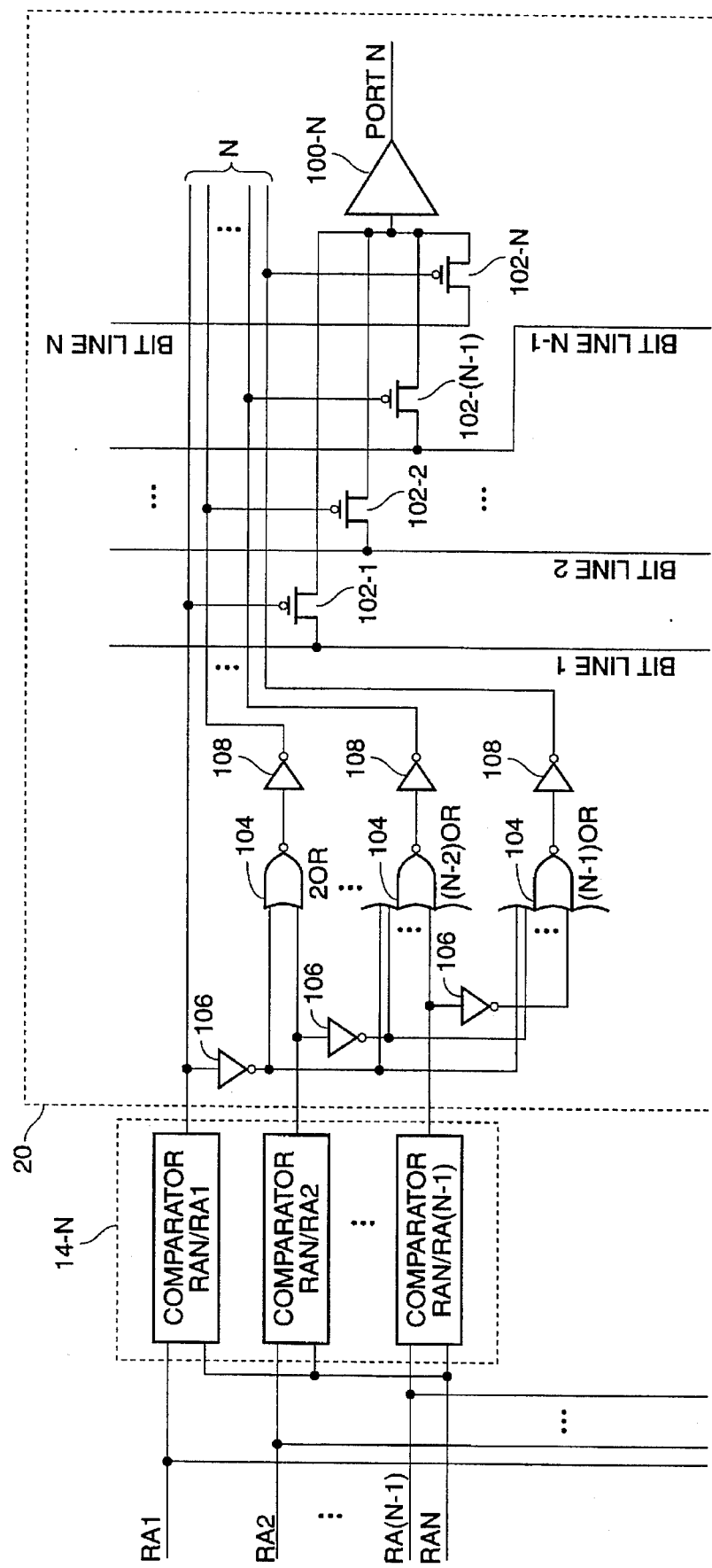
FIG. 4 is a circuit diagram of the data transfer unit according to the present invention.
Figure 4B:
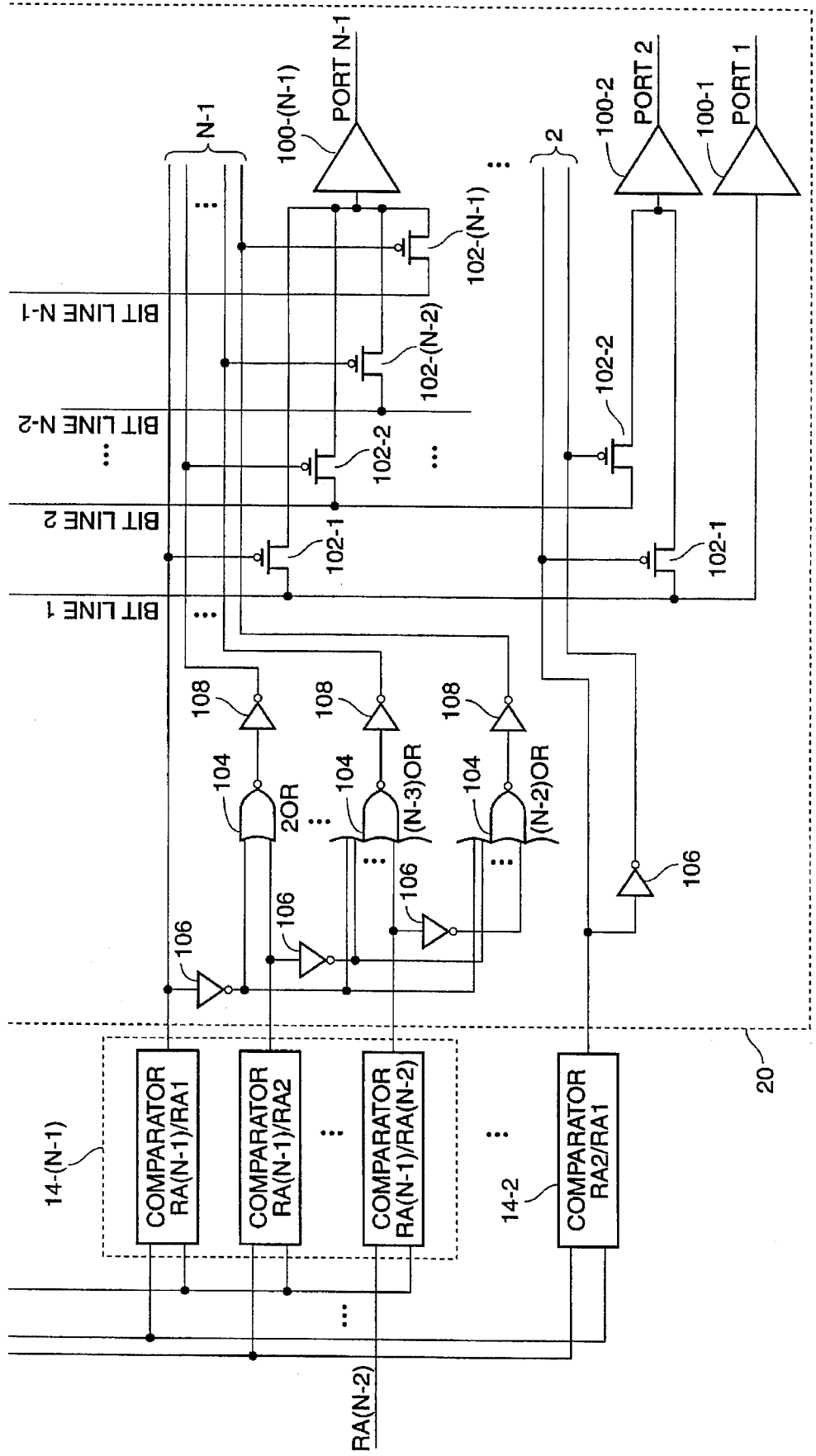
Figure 5:
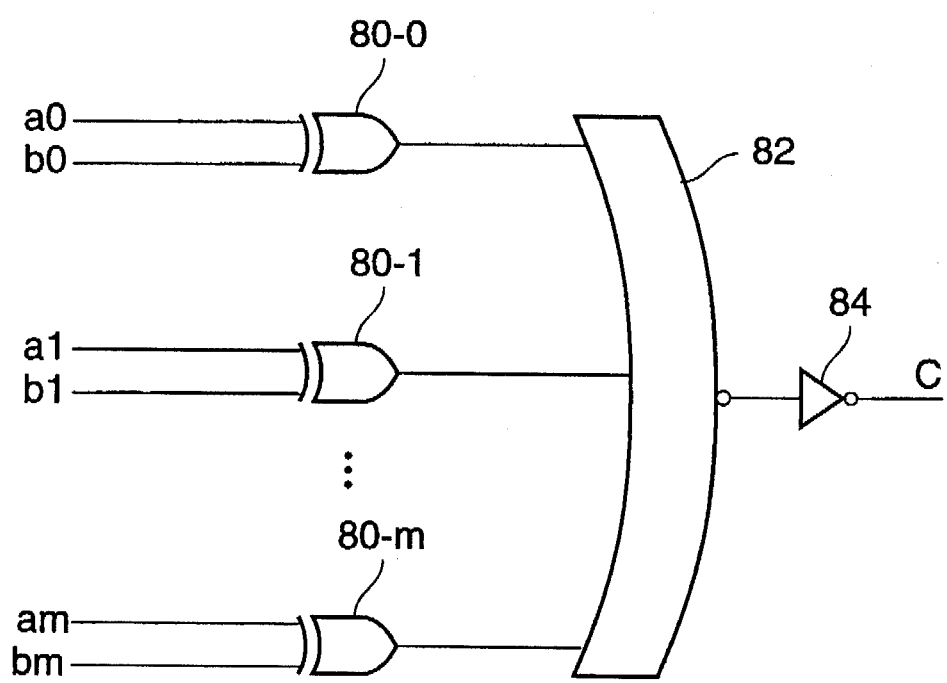
FIG. 5 is a circuit diagram of a read address comparator suitable for use in the multiport register file according to the present invention.

Column 3, line 40: replace "FIG. 4 is" with --FIGS. 4A and 4B, combined along the bottom of FIG. 4A and FIG. 4B, respectively, are--.

Column 5, line 26: replace "port I'" with --port 1--.

Column 5, line 55: replace "42N/2" with --42-N/2--.

Column 7, line 36: replace "FIG. 4" with --FIGS. 4A and 4B--.

Column 7, line 38: replace "FIG. 4" with --FIGS. 4A and 4B--.

Column 7, line 41: replace "may" with --many--.

Column 7, line 56: replace "FIG. 4" with --FIG. 4A--.

Column 7, line 62: replace "FIG. 4" with --FIG. 4A--.

UNITED STATES PATENT AND TRADEMARK OFFICE
CERTIFICATE OF CORRECTION

PATENT NO.   :   5,657,291
DATED        :   August 12, 1997
INVENTOR(S)  :   Andrew V. Podlesny, Guntis V. Kristovsky, Alexander V. Malshin It is certified that error appears in the above-identified patent and that said Letters Patent is hereby corrected as shown below:

Column 7, line 64: replace "RA1 through RA(N-1), in read address" with --RA1 through (RA(N-1). As shown in FIG. 4B, in read address--.

Column 8, line 21: replace "FIG. 4" with --FIGS. 4A and 4B--.

Column 9, line 17: replace "comparator group 14-2, the gate" with --comparator group 14-2 of FIG. 4B, the gate--.

Column 10, line 10: replace "gates" with --gate--.

Signed and Sealed this

Seventh Day of April, 1998

Attest:

BRUCE LEHMAN

*Attesting Officer*        *Commissioner of Patents and Trademarks*